United States Patent [19]

Workman et al.

[11] 3,860,466

[45] Jan. 14, 1975

[54] NITRIDE COMPOSED MASKING FOR INTEGRATED CIRCUITS

[75] Inventors: Wilton L. Workman; Billy M. Martin, both of Dallas, Tex.

[73] Assignee: Texas Instruments Incorporated, Dallas, Tex.

[22] Filed: Oct. 22, 1971

[21] Appl. No.: 191,666

[52] U.S. Cl. ........................ 156/11, 148/187, 156/17

[51] Int. Cl. ........................ C23f 1/02, B29c 17/08

[58] Field of Search ......... 156/11, 17; 148/1.5, 175, 148/187

[56] References Cited

UNITED STATES PATENTS

| | | | |
|---|---|---|---|
| 3,479,237 | 11/1969 | Bergh et al. | 156/11 |
| 3,607,480 | 9/1971 | Harrap et al. | 156/11 |
| 3,798,080 | 3/1974 | Henning et al. | 148/187 |

*Primary Examiner*—William A. Powell
*Assistant Examiner*—Brian J. Leitten
*Attorney, Agent, or Firm*—Harold Levine; James T. Comfort; Gary C. Honeycutt

[57] ABSTRACT

A method for selectively masking a substrate surface, as in the fabrication of a semiconductor device, which includes the steps of forming a first layer of a masking material, e.g., silicon dioxide, on a surface of the substrate, forming an adherent layer of a second masking material, e.g., silicon nitride, on the first layer, and then forming a second layer of silicon dioxide on the silicon nitride layer. Openings are formed extending through preselected locations in the second oxide layer to expose underlying regions in the silicon nitride layer in a preselected pattern. The portions of silicon nitride exposed through the openings are selectively removed to expose preselected portions of the underlying first oxide layer, and then the exposed portions of the first oxide layer are removed to define a composite diffusion mask exposing preselected portions of the surface of the silicon semiconducor body. Subsequent diffusion and metallization steps may be then effected to form a semiconductor device.

4 Claims, 9 Drawing Figures

INVENTORS
Billy M. Martin
Wilton L. Workman

BY

ATTORNEY

NITRIDE COMPOSED MASKING FOR INTEGRATED CIRCUITS

The present invention relates generally to a method of selectively masking a substrate surface, and more particularly is directed to an improved method for forming a composite diffusion mask in the fabrication of a semiconductor device.

Typically in the fabrication of semiconductor devices, such as integrated circuits, in which a plurality of circuit elements are formed in a body of semiconductor material, a variety of sequential diffusion steps are required in which a series of masking layers are utilized for defining the areas on the surface of the semiconductor body to be subjected to the diffusion procedure. The photolithographic operations required for defining the mask patterns require critical alignment between adjacent regions on the surface of the semiconductor body to allow for mask misalignment, incorrect aperture size, overetching during removal procedures, etc. The spacing between various apertures in the masks becomes quite critical as the complexity of the device being fabricated increases since it is desirable to provide a large number of circuit elements in a relatively small area on the semiconductor body. However, the provision of liberal tolerance allowances results in a substantial waste of the space available on the semiconductor body. Consequently, improved packing density in which a large number of circuit elements are formed in a limited area becomes difficult to achieve. Although various proposals have been attempted for utilizing relatively thinner masks in order to improve resolution, such attempts have generally met with failure since sequential mask registrations still remain a problem, while a relatively thin mask may fail to adequately protect the underlying surface regions which it covers.

Accordingly, it is an object of the present invention to provide high resolution thin-film masking techniques for use in fabricating microminiature devices.

It is another object of the present invention to provide a process in which a single composite mask is provided having a plurality of critically-spaced sets of areas defined therein with an improved degree of resolution, thereby reducing the number of critical alignment steps normally required in a multiple-mask processing sequence.

It is a further object of the present invention to provide a more efficient process for fabricating semiconductor devices having a substantially increased packing density of circuit elements.

Figure 6:
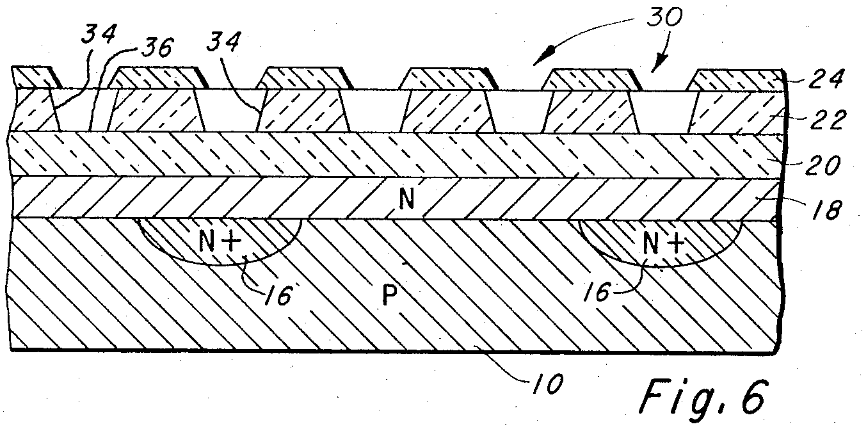
Figure 7:
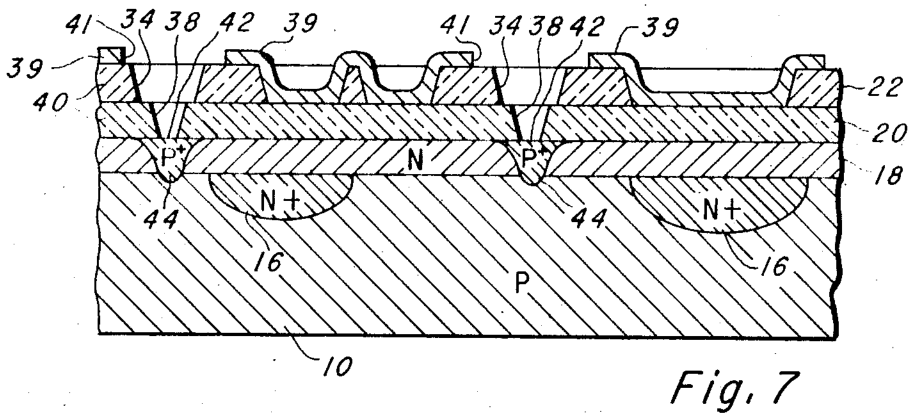
Figure 8:
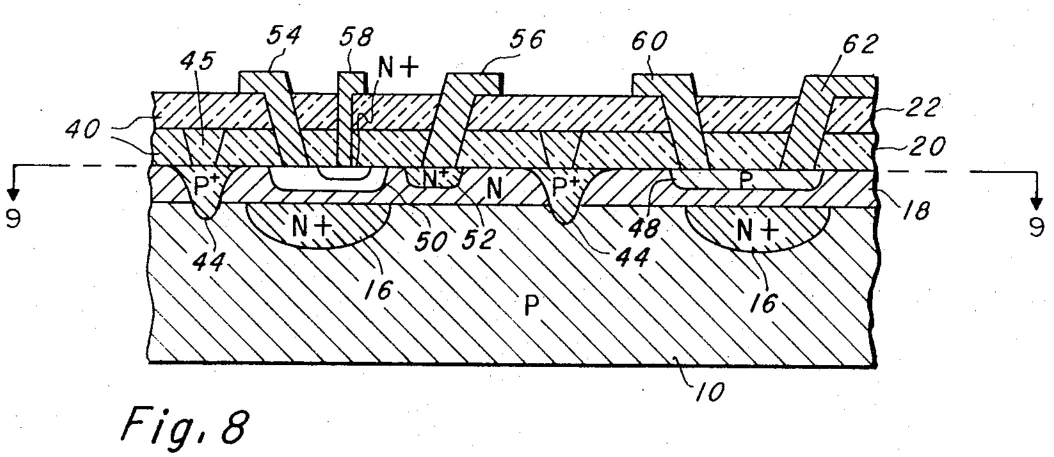
Figure 9:
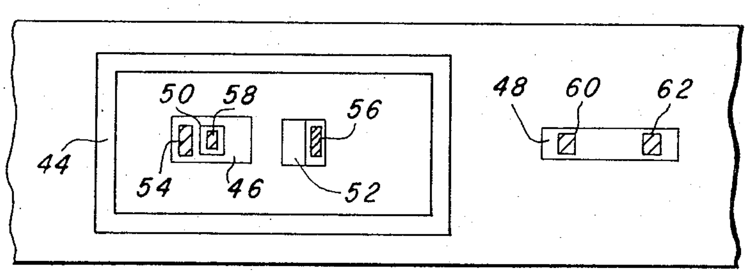

Various additional objects and advantages of the present invention will be readily apparent from the following detailed description and accompanying drawings wherein:

FIG. 1–8 are partial, enlarged, vertical sectional views of a monocrystalline silicon semiconductor body, illustrating various successive stages in the fabrication of a semi-conductor device having a plurality of circuit elements formed therein; and FIG. 9 is a view taken along lines 9–9 of FIG. 8, illustrating the spacing achieved in accordance with the techniques of the present invention.

One aspect of the invention is embodied in a method which begins with the step of patterning a first adherent thin-film mask on a substrate surface, to provide the mask with a plurality of accurately-spaced sets of apertures.

A second adherent thin-film mask is then patterned on the first mask to selectively expose only one set of apertures in the first mask. A desired operation is then carried out to modify the exposed substrate locations in some known manner, such as by etching, for example, to open apertures in a substrate film. Subsequently, a third adherent thin-film mask is patterned on the composite structure, to selectively expose only a second set of apertures in the first mask, and thereby permit a second desired operation to be carried out to modify the re-exposed substrate locations in some known manner. It will be recognized that each set of apertures in the first mask could readily have been patterned in a separate mask, thereby permitting the use of only two masks instead of three; but such a procedure would not permit a sufficiently accurate spacing of the second aperture set with respect to the first aperture set, as desired in accordance with the invention, because of the inherent limitations upon the accuracy with which a second mask can be aligned with respect to a first mask positioned on a given substrate.

Figure 1:
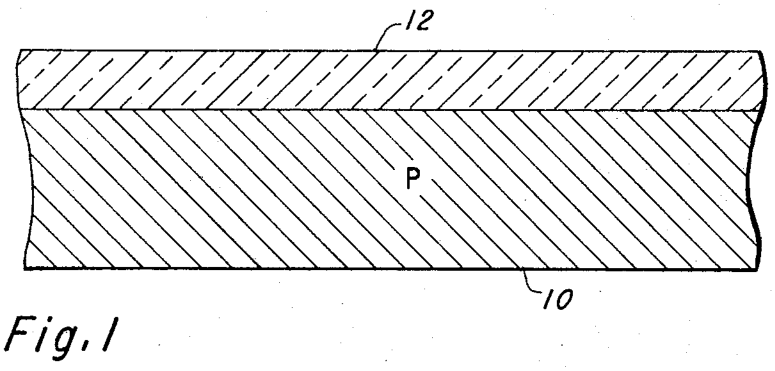

Referring generally to the drawings and initially to FIG. 1, a body 10 of a preselected conductivity-type silicon semiconductor material is provided and illustrated as a P-type material, although N-type material may also be utilized if desired. In this connection it should be noted that the conductivity-types mentioned herein may be readily reversed if desired, and are set forth purely for illustrative purposes. The body 10 may be suitably prepared for processing utilizing conventional techniques and a silicon dioxide layer 12 is provided on a surface thereof using known techniques. For example, the dioxide layer 12 may be provided by thermal oxidation of an appropriately prepared surface of the body 10 at a temperature of approximately 1,000°C for a time sufficient to provide a dioxide thickness of approximately 1,500–6,000 angstroms.

Figure 2:
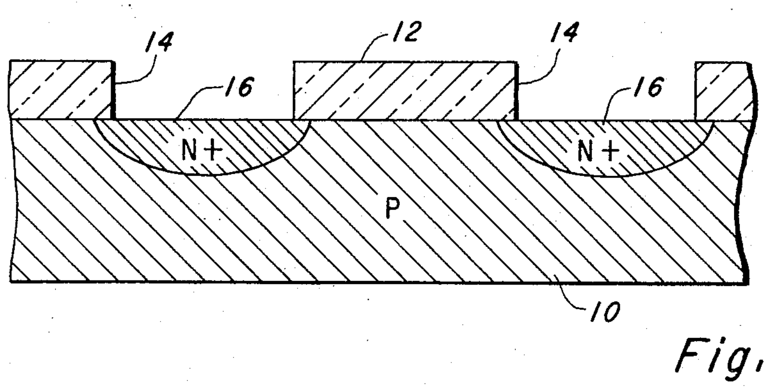

As shown in FIG. 2, a plurality of aperatures 14 are provided in the dioxide layer 12 and a diffusion step is effected in order to form a plurality of opposite conductivity-type regions 16 at the surface of the semiconductor body these regions 16 being commonly referred to in the art as buried layers and being shown as N+ regions. The buried layers 16 may be typically formed by diffusing an impurity such as antimony or arsenic into the surface of the semiconductor body 10 utilizing conventional techniques, and functions to improve the operating characteristics of the device, which is being fabricated.

Figure 3:
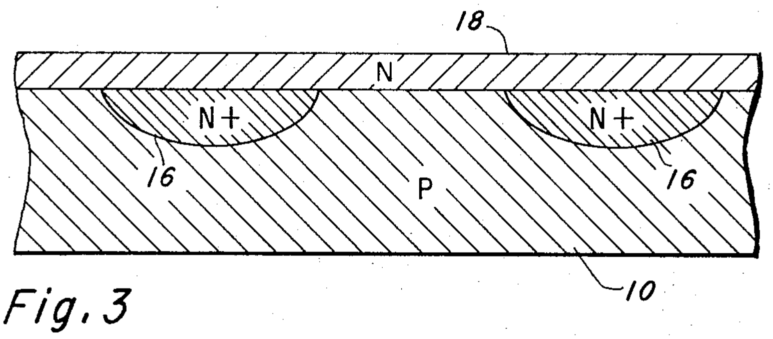

The remainder of the dioxide layer 12 is then removed as shown in FIG. 3 and replaced by an epitaxially deposited layer 18, which covers substantially the entire surface of the body 10, as well as the buried layers 16 formed at the surface thereof. As shown, the epitaxial layer 18 is of an opposite conductivity-type with respect to the underlying semiconductor body 10, i.e., is of N-type material doped with arsenic, for example, and, thus, is of the same conductivity-type as the buried layers 16. Preferably, the epitaxial layer 18 is relatively thin in relation to the thickness of the semiconductor body 10 so as to aid in achieving the desired miniaturization of the ultimate device, and typically may have a thickness of between 2 to 4 microns.

Figure 4:
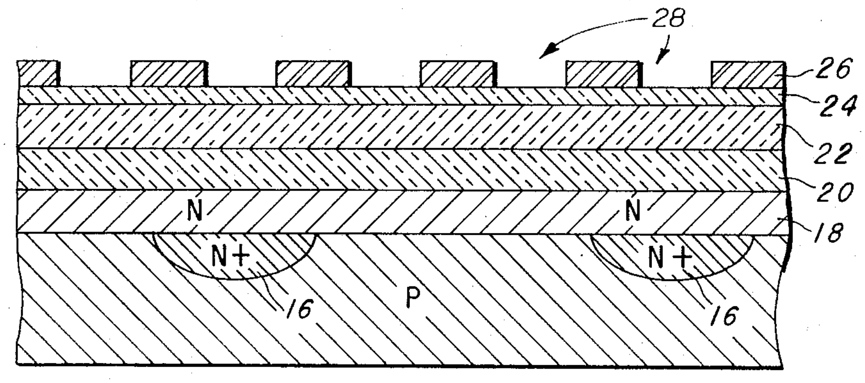

Referring now to FIG. 4, a first layer 20 of a preselected material is deposited on the exposed surface of the epitaxial layer 18. This first layer 20 comprises a material which functions to passivate the surface of the epitaxial layer 18, as well as serving to protect the epitaxial layer from reacting with subsequently deposited materials, which might produce undesired electrical characteristics. The layer 20 preferably comprises an insulator such as silicon dioxide, although various other materials may be utilized in certain instances, if they fulfill the above-mentioned functions. The layer 20 may have a thickness of aproximately 1,500 A, although its exact thickness is not material, as long as it is sufficient to protect the underlying epitaxial layer 18 against undesired diffusion reactions during subsequent processing. The silicon dioxide layer 20 may be provided in a conventional manner by thermal oxidation of the surface of the epitaxial layer 18 in a suitable reactor at a temperature and for a time sufficient to produce a desired oxide thickness. A layer 22 is then deposited on the silicon dioxide layer 20, the layer 22 preferably comprising a material such as silicon nitride. The silicon nitride layer 22 may be deposited in the same reactor as the underlying silicon dioxide layer 20, if desired, and generally may have approximately the same thickness. In certain instances the silicon nitride layer may be replaced by other materials such as alumina, and various refractory metals such as molybdenum, tungsten, etc., although in the event conductive materials were utilized their removal would be required prior to effecting subsequent metallization operations. In accordance with an important feature of the present invention, another layer 24 which also preferably comprises silicon dioxide is then formed on the surface of the silicon nitride layer 20, utilizing conventional techniques, such as exposing the silicon nitride layer to steam at an elevated temperature for a predetermined period of time.

In accordance with an important feature of the present invention the layer 24 is formed having a thickness no more than one-fifth as great as the thickness of either layer 20 or layer 22, and preferably having a thickness which is at least an order of magnitude less than either layer 20 or layer 22, and in one preferred embodiment has a thickness of approximately 300 A. Since the outermost or second layer 24 is extremely thin, it is possible to form a desired pattern of apertures therein with an extremely high degree of resolution in which the spacing between adjacent apertures is extremely closely defined with a high degree of accuracy due to the thinness of the layer. In addition, since the layer is relatively thin, a relatively short period of time is required for the etching procedure for forming the apertures to be effected via the patterned photoresist layer 26 thereby minimizing problems of photoresist lift or the like. As a result, it is possible to form a desired pattern of apertures in the layer 24 utilizing conventional photolithographic techniques for exposing preselected regions in the underlying layer 22, which may be then selectively removed by etching or the like. Subsequently, the regions in the first oxide layer 20 which are exposed similarly may be removed to expose selected regions in the epitaxial layer 18 so that the requisite diffusion steps may be effected in order to form desired circuit elements. In this regard, for the sake of illustration, the process in accordance with the present invention will be subsequently described in conjunction with the formation of a transistor, a resistor, and isolation regions therebetween, although it should be noted that various other circuit elements and combinations thereof may be provided utilizing the techniques of the present invention, as described herein. In proceeding with the process, conventional photolithographic techniques are utilized for depositing, selectively exposing, and etching a photoresist layer to define a mask pattern 26 of photoresist material, as illustrated, in which selected surface regions 28 of the underlying oxide layer 24 are exposed by apertures in the photoresist mask, while the remainder of the layer 24 is covered and is protected by the photoresist layer. The exposed regions 28 of the silicon dioxide layer 24 are then removed preferably by exposure to a selective etching procedure in which a preselected etchant is applied thereto which attacks the silicon dioxide material but does not substantially react with the protective photoresist mask 26. Typically, a solution of hydrofluoric acid may be utilized in this regard. Since the layer 24 is relatively thin, the etching may be accomplished relatively rapidly and in certain instances may only require 1 or 2 minutes, thereby minimizing problems of undercoating and photoresist lift and maximizing the accuracy of the etching procedure.

Figure 5:
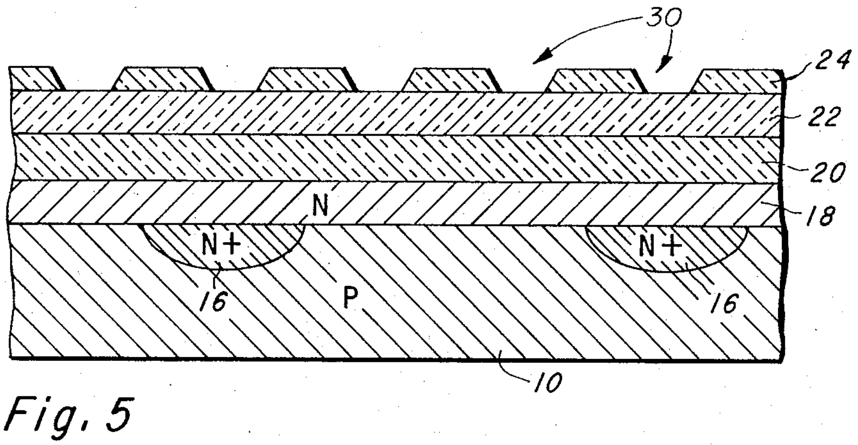

Referring now to FIG. 5, the layer 24 is illustrated having a plurality of apertures 30 therein located at the previously exposed regions 28 which were not covered by the photoresist layer 26 which is removed subsequent to the etching procedure. The apertures 30 are defined in an extremely precise spatial relationship with respect to each other due to the high resolution achieved in forming this pattern of apertures in the relatively thin layer 24. These apertures expose the first portion of a subsequently formed composite mask, as will be explained hereinafter, for use in forming isolation regions, the base and collector regions of a transistor and a resistor. In this regard it should be noted that all of these regions are defined by and spaced from each other with a single mask so that critical spatial alignments, as well as aperture sizes, may be incorporated into a relatively precisely defined, single mask pattern. The apertured layer 24 is then employed as an etchant mask in the selective removal of portions of the silicon nitride intermediate layer 22, exposed by the apertures 30. In this connection a preselected etchant is applied which attacks silicon nitride at a substantially faster rate than it reacts with silicon dioxide so as to effect the removal of the portions of the silicon nitride layer 22.

Accordingly, referring to FIG. 6, a plurality of apertures 34 are formed in the silicon nitride layer 22 generally in registration with the apertures 30 in the overlying silicon dioxide layer 24. One example of a suitable selective etchant that attacks silicon nitride at a substantially faster rate than it reacts with silicon dioxide comprises phosphoric acid which may be utilized in this regard. In addition, as may be seen in FIG. 6, during formation of the apertures 34 a certain amount of undercutting occurs, whereby the upper portion of the aperture is of a slightly larger size than the lower portion and extends slightly beneath the covering defined by the overlying silicon dioxide layer 24. This occurs because part of the aperture is in contact with the etchant for a longer period of time as the etchant proceeds through the material. However, this amount of undercutting is generally immaterial since the critical spatial alignment between various of the regions is maintained due to the precise pattern defined in the relatively thin silicon dioxide outer layer 24.

Since the desired pattern is now defined in the intermediate silicon nitride layer 22, the outer layer 24 of silicon dioxide may be removed. The silicon nitride layer 22 serves as one etch mask for subsequent selective oxide removals in layer 20. This will provide extremely accurate spacings between these subsequent openings for impurity diffusion since all openings in layer 22 were originally defined from a single mask thus eliminating registration errors between multiple masks. Referring to FIG. 7 an oversize mask is used to expose aperture 41 (aperture 41 > aperture 34) in photoresist layer 39 to select areas for removal of layer 22 for an impurity diffusion (P+ isolation in the case shown). Layer 22 is removed by exposure to an etchant which attacks silicon dioxide at a substantially faster rate than it reacts with silicon nitride. One example of an etchant which may be utilized in this regard and which attacks silicon dioxide substantially more rapidly than it reacts with silicon nitride comprises a saturated solution of ammonium fluoride in water to which 2 percent by weight of hydrofluoric acid has been added. Consequently, a composite mask generally indicated by the reference numeral 40 comprising the apertured first silicon dioxide layer 20 and the overlying apertured silicon nitride layer 22 is provided having a preselected pattern of apertures which expose selected surface regions 42 in the underlying epitaxial layer 18. This composite mask 40 may be utilized as a diffusion mask so that suitable conductivity-type determining impurities may be introduced into exposed regions of the epitaxial layer 18 in order to form desired circuit elements. In addition, it should be noted that the relative alignment of the various surface regions 42 which are in registration with the respective apertures 38 and 34 in the overlying mask 40 are precisely spaced with respect to each other so that the single composite mask may be utilized in effecting a number of diffusion operations in forming a plurality of circuit elements which are similarly in a precise spatial relationship with respect to each other.

Typically, an initial diffusion step is effected for forming a plurality of isolation regions 44, which in the illustrated embodiment comprises P+ regions in order to establish the requisite electrical isolation between various regions of the epitaxial layer 18. The location of the P+ isolation regions 44 is relatively significant since they must be arranged intermediate selected regions in the epitaxial layer 18 in order to provide electrical isolation between such regions to preclude undesired interaction between closely spaced circuit elements which are subsequently formed in the epitaxial layer. Since the composite mask 40 provides for the requisite spacing between the various regions this critical spacing is conveniently accomplished in view of the fact that the composite mask 40 has been patterned by a high resolution procedure as previously explained. The P+ isolation regions 44 may be provided in a conventional manner by diffusing suitable conductivity-type determining impurities in a gaseous atmosphere at an elevated temperature into the apertures which are defined by the regions 44, while suitably masking other exposed apertures in the silicon nitride layer 22 to prevent diffusion into these areas. For example, a gaseous atmosphere containing an impurity, such as boron, may be employed for effecting the formation of the P+ isolation regions 44. Typically, during such a diffusion operation an oxide layer reforms overlying the P+ region 44 and may occupy the apertures in the layers 20 and 22 which are in registration with and expose the regions 44.

Thus, referring to FIG. 8 it may be seen that the apertures in the silicon dioxide layer 20 and in the silicon nitride layer 22 which previously overlaid the regions 44 are occupied by regrown oxide material 45. In addition, various of the other exposed surface regions 42 of the epitaxial layer 18 may be selectively exposed to the diffusion of conductivity-type determining impurities in order to form the regions of the desired circuit elements in the epitaxial layer utilizing conventional photolithographic masking techniques in which various selected areas are masked while diffusion is effected into exposed regions. However, it should be noted that the relative spacing and alignment of various regions is provided by the composite mask 40. Thus, a P-type region 46, which defines the base of a subsequently defined transistor is provided in the epitaxial layer 18, as shown and simultaneously therewith another P-type region 48, which is spaced therefrom may be provided in the epitaxial layer for defining a resistor region. Similarly, an N+ region 50 may be then provided in a portion of the area defined by the base region 46 to define the emitter portion of the transistor structure utilizing conventional photolithographic techniques. The emitter diffusion is not defined by the composite mask 40, but must be aligned conventionally to the base. Another N+ region 52 may be formed at another spaced location defined by the composite mask 40 to define the collector region of the transistor structure. Thus, the spacing between the collector region 52 and the base region 46 is defined by the composite mask 40 so that the critical spacing between these regions of the transistor structure is maintained with a high degree of accuracy. Conventional diffusion techniques may be employed in conventional reactors in forming the various conductivity-type regions. For example, a gaseous atmosphere including antimony or arsenic may be utilized in forming the N+ emitter and collector regions, while a gaseous atmosphere including boron may be utilized in forming the P-type base region. As further illustrated in FIG. 8, upon completion of the formation of the various regions of the transistor structure and of the resistor structure, a pattern of conductive contacts for establishing electrical contact with the various regions is provided. The pattern of contacts or metallization may be deposited in various ways utilizing conventional techniques. The various details in conjunction with the formation of the contact areas are not described in detail in that these procedures are believed to be well known in the art. However, it should be noted that during the diffusion operations for forming the various transistor regions and the base region additional oxide preferably is not formed in the apertures exposing these regions until the contacts have been formed; except the region 46 which defines the base is oxidized during the interval when the resistor region 48 is being formed. Thus the requisite contacts may be conveniently established made to these regions through the apertures defined in the composite mask 40. In forming the emitter contact it is merely necessary to form an aperture in the oxide overlying the emitter region 50 for forming the contact to the emitter region. Accordingly, this is the only region which must be relatively carefully sized and aligned with respect to other regions. In establishing the contact pattern, a contact 52 may be conveniently formed through the apertures in the composite mask 40 to the base region 46 and supported on the outer silicon nitride layer 22, as shown. Similarly, a contact 56 may be formed to the collector region 52 while a contact 58 is established with the emitter region 50 utilizing suitable photolithographic techniques for making an aperture in the oxide layer overlying the emitter region 50. To complete the metallization suitable contacts 60, 62 are made to opposite ends of the resistor region 48 as shown and similarly supported on the silicon nitride layer 22. If desired, suitable interconnections between the various metallic contacts may be effected, although for simplicity of illustration such interconnections are not shown in detail.

Referring to FIG. 9, the spacing between the various regions and contacts is illustrated to further demonstrate the simplicity with which critical spatial relationships between various regions is achieved in accordance with the present invention. As shown, the base region 46 is spaced from the collector region 52 by a predetermined distance which is relatively easily and conveniently maintained since this spacing is maintained by the pattern of the composite mask 40. The contact 54 to the base region 46 is conveniently formed in the base region 46. The contact 56 to the collector region 52 is formed through the previously provided aperture in the composite mask. Similarly, the formation of the contacts 60, 62 to the resistor region 48 are conveniently achieved through the previously defined apertures in the composite mask 40. Thus, these contacts are made with minimal additional mask alignment procedures, which substantially enhances the efficiency of the process, although the contact 58 to the emitter region 50 is separately effected. The metallization utilized in forming the contacts may comprise various metals such as platinum, aluminum, etc. In addition, it should be noted that if overetching should occur during the formation of the resistor region 46 so that a portion of the epitaxial region beyond the resistor region 48 is exposed to metallization, a short circuit is not established. Instead, a Schottky diode is formed, rather than a short circuit, which has no effect on circuit operation. Thus, the resistor contacts 60, 62 may be conveniently established with the possibility of error due to misalignment being substantially precluded.

Accordingly, a unique processing technique has been described in detail for forming a composite diffusion mask in which a number of critical spatial alignments are achieved in a simplified and accurate fashion so as to provide an improved method for use in fabricating semiconductor devices, such as integrated circuits.

Various changes and modifications in the above-described procedures will be readily apparent to those skilled in the art and any of such changes or modifications are deemed to be within the spirit and scope of the present invention as set forth in the appended claims.

What is claimed is:

1. A method for plural-stage thin-film masking of a substrate comprising:

a. forming a first adherent, thin-film mask of a material resistant to a first etchant on a surface of said substrate, said mask having a pattern of apertures therein selected to provide accurate spacing between a plurality of substrate locations;

b. forming a second adherent, thin-film mask of a material resistant to a second etchant, but not to said first etchant, on said first mask, said second mask having a pattern of apertures therein which exposes only a first preselected number of the apertures in said first mask; and c. subsequently forming a third mask, be selective etching with said first etchant, on said first mask, said third mask having a pattern of apertures therein selected to expose only a second preselected number of the apertures in said first mask.

2. A method as defined by claim 1 wherein said substrate is an oxide-passivated semiconductor body, and wherein said method further includes the steps of etching apertures in the oxide after step (b), followed by selective diffusion of an impurity into the exposed locations of said semiconductor.

3. A method as defined by claim 2, further including the steps of etching apertures in the oxide after step (c), followed by selective diffusion of an impurity into the exposed locations of said semiconductor.

4. A method as defined by claim 3 wherein said first thin-film mask is silicon nitride, and said second thin-film mask is silicon dioxide.

* * * * *